US011075651B2

(12) United States Patent
Usatyuk et al.

(10) Patent No.: US 11,075,651 B2
(45) Date of Patent: Jul. 27, 2021

(54) GENERALIZED LOW-DENSITY PARITY CHECK CODES (GLDPC)

(71) Applicant: Huawei Technologies Co., Ltd., Shenzhen (CN)

(72) Inventors: Vasily Stanislavovich Usatyuk, Moscow (RU); Nikita Andreevich Polianskii, Moscow (RU); Ilya Viktorovich Vorobyev, Moscow (RU); Vladimir Anatolyevich Gaev, Moscow (RU); German Viktorovich Svistunov, Moscow (RU); Mikhail Sergeevich Kamenev, Moscow (RU); Yulia Borisovna Kameneva, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/741,199

(22) Filed: Jan. 13, 2020

(65) Prior Publication Data

US 2020/0153457 A1 May 14, 2020

Related U.S. Application Data

(63) Continuation of application No. PCT/RU2017/000522, filed on Jul. 13, 2017.

(51) Int. Cl.
*H03M 13/00* (2006.01)
*H03M 13/11* (2006.01)

(52) U.S. Cl.
CPC ..... *H03M 13/1174* (2013.01); *H03M 13/616* (2013.01)

(58) Field of Classification Search
CPC ................. H03M 13/1174; H03M 13/616
See application file for complete search history.

(56) References Cited

U.S. PATENT DOCUMENTS

| 7,116,710 | B1 | 10/2006 | Jin et al. |
| 7,421,032 | B2 | 9/2008 | Jin et al. |
| 7,627,801 | B2 | 12/2009 | Jin et al. |
| 7,916,781 | B2 | 3/2011 | Jin et al. |
| 8,284,833 | B2 | 10/2012 | Jin et al. |
| 2011/0219286 | A1 | 9/2011 | Kamiya |
| 2012/0210189 | A1 | 8/2012 | Sugihara et al. |

FOREIGN PATENT DOCUMENTS

| CN | 1499731 A | 5/2004 |
| CN | 102891686 A | 1/2013 |
| CN | 104868926 A | 8/2015 |

(Continued)

OTHER PUBLICATIONS

Guneri et al., Structure and Performance of Generalized Quasi-Cyclic Codes. Feb. 1, 2017, OS.IT pp. 1-19 (Year: 2017).*

(Continued)

*Primary Examiner* — Samir W Rizk
(74) *Attorney, Agent, or Firm* — Leydig, Voit & Mayer, Ltd.

(57) ABSTRACT

Provided is a system and method for determining a generalized Low-Density Parity-Check (LDPC) code for forward error correction channel coding that has a repeat-accumulate code structure.

15 Claims, 4 Drawing Sheets

(56) References Cited

FOREIGN PATENT DOCUMENTS

EP 1816750 A1 8/2007

OTHER PUBLICATIONS

Kumar et al., A detailed study on LDPC encoding techniques. 2018, WHIOCE publishing, pp. 1-5 (Year: 2018).*

Zhang et al., "A Class of Efficient-Encoding Generalized Low-Density Parity-Check Codes," 2001 IEEE International Conference on Acoustics, Speech, and Signal Processing, Proceedings (Cat. No. 01CH37221), pp. 2477-2480, Institute of Electrical and Electronics Engineers, New York, New York (May 2001).

Tanner "A Recursive Approach to Low Complexity Codes," IEEE Transactions on Information Theory, vol. IT-27, No. 5, pp. 533-547, Institute of Electrical and Electronics Engineers, New York, New York (Sep. 1981).

Richardson et al., "Efficient Encoding of Low-Density Parity-Check Codes," IEEE Transactions on Information Theory, vol. 47, No. 2, pp. 638-656, Institute of Electrical and Electronics Engineers, New York, New York (Feb. 2001).

Liu et al., "On LDPC Code Ensembles with Generalized Constraints," 2017 IEEE International Symposium on Information Theory (ISIT), pp. 371-375, Institute of Electrical and Electronics Engineers, New York, New York (Jun. 2017).

Lentmaier et al., "On Generalized Low-Density Parity-Check Codes Based on Hamming Component Codes," IEEE communications Letters, vol. 3, No. 8, pp. 248-250, Institute of Electrical and Electronics Engineers, New York, New York (Aug. 1999).

Yang et al., "Design of Efficiently Encodable Moderate-Length High-Rate Irregular LDPC Codes," IEEE Transactions on Communications, vol. 52, No. 4, pp. 564-571, Institute of Electrical and Electronics Engineers, New York, New York (Apr. 2004).

Xie et al., "Design of Efficiently-Encodable Generalized LDPC Codes," 2010 IEEE International Conference on Communications, Total 5 pages, Institute of Electrical and Electronics Engineers, New York, New York (May 2010).

Poulliat et al., "Design of Regular (2, dc)-LDPC Codes over GF(q) Using Their Binary Images," IEEE Transactions on Communications, vol. 56, No. 10, pp. 1626-1635, Institute of Electrical and Electronics Engineers, New York, New York (Oct. 2008).

Cordaro et al., "Optimum (n, 2) Codes for Small Values of Channel Error Probability (Correspondence)," IEEE Transactions on Information Theory, vol. 13, No. 2, pp. 349-350, Institute of Electrical and Electronics Engineers, New York, New York (Apr. 1967).

* cited by examiner

GENERALIZED LOW-DENSITY PARITY CHECK CODES (GLDPC)

CROSS-REFERENCE TO RELATED APPLICATIONS

This application is a continuation of International Application No. PCT/RU2017/000522, filed on Jul. 13, 2017, the disclosure of which is hereby incorporated by reference in its entirety.

TECHNICAL FIELD

The present disclosure relates to Generalized Low-Density Parity-Check (GLDPC) codes for channel coding in digital communication systems. In particular, the present disclosure relates to GLDPC codes which allow for easy encoding.

BACKGROUND

FIG. 1 shows a block diagram illustrating a generic digital communications system 10 in which the elements of the present disclosure may be implemented. The system 10 includes a transmitting side 10a comprising a generic encoder 12 and a receiving side 10b comprising a generic decoder 14. The input of the generic encoder 12 at the transmitting side may be an information sequence $IS_1$ of k bits to which a redundancy sequence of r bits is added in an encoding operation performed by the generic encoder 12, thereby producing an encoded information sequence $IS_2$ of k+r=n bits which may be forwarded to a modulator 16.

The modulator 16 may transform the bit sequence $IS_2$ into a modulated signal vector CH_IN which is in turn transmitted through a channel 18 such as, for example, a radio channel or an optical channel. Since the channel 18 is usually subject to noisy disturbances, the channel output CH_OUT may differ from the channel input CH_IN.

At the receiving side 10b, the channel output vector CH_OUT may be processed by a demodulator 20 which produces reliability values (e.g., likelihoods, likelihood ratios, or log likelihood ratios) regarding the bit values of the received bit sequence $IS_3$. The generic decoder 14 may use the redundancy in the received bit sequence $IS_3$ in a decoding operation to correct errors and produce a decoded information sequence $IS_4$ which is an estimate of the information sequence $IS_1$.

The encoding operation and the decoding operation may be governed by an LDPC code that defines the redundancy sequence to be added to an information sequence $IS_1$. In other words, an LDPC code provides a rule set to establish a codebook that contains all possible code words to be transmitted through the channel 18. This allows identifying and possibly correcting transmission errors which reveal themselves in received bit sequence $IS_3$ that does not correspond to a code word contained in the codebook established by the LDPC code on which the transmission is based.

In the general formulation of channel coding, an LDPC code may employ a generator matrix G for the encoding operation in the generic encoder 12 and a parity-check matrix H for the decoding operation in the generic decoder 14.

For a LDPC code with an information sequence $IS_1$ of size l×k, a code word $IS_2$ of size l×n and a redundancy (parity) sequence of r=(n−k) bits, the generator matrix G has size k·n, and the parity-check matrix H has size r·n=(n−k)·n. The parity-check matrix $H_{r \times n}$ and the generator matrix $G_{k \times n}$ enjoy the orthogonality property, which states that for any generator matrix $G_{k \times n}$ with k linearly independent rows there exists a parity-check matrix $H_{r \times n}$ with r=(n−k) linearly independent rows. Thus, any row of the generator matrix $G_{k \times n}$ is orthogonal to the rows of the parity-check matrix $H_{r \times n}$ such that the following equation is satisfied:

$$G_{k \times n} \cdot H_{n \times r}^T = 0$$

The encoding operation can be performed by means of a multiplication between the information sequence $IS_1$ and the generator matrix $G_{k \times n}$, wherein the result of the multiplication provides the encoded output sequence $IS_2$ as follows:

$$IS_2 = IS_1 \cdot G_{k \times n}$$

At the receiving side, due to the orthogonality property between the generator matrix $G_{k \times n}$ and the parity-check matrix $H_{r \times n}$, the following equation should be satisfied:

$$H_{r \times n} \cdot IS_3^T = 0$$

where $IS_3$ is the received information sequence of size l×n. If the above equation is verified, the information signal estimate $IS_4$ is likely to be correct.

Once the parity-check matrix $H_{r \times n}$ is generated, it is possible to obtain the generator matrix $G_{k \times n}$ and vice versa. Accordingly, any process of determining a parity-check matrix $H_{r \times n}$ may be mapped to an equivalent process of obtaining a generator matrix $G_{k \times n}$, so that any process disclosed throughout the description and claims in relation to determining a parity-check matrix $H_{r \times n}$ shall be understood as encompassing the equivalent process of obtaining a generator matrix $G_{k \times n}$ and vice versa.

For employing an LDPC code in the generic encoder 12 and the generic decoder 14, the generic encoder 12 and the generic decoder 14 may be provided with data/parameters defining the generator matrix $G_{k \times n}$ and parity-check matrix $H_{r \times n}$, respectively. The provided data/parameters may be processed by one or more processors at the encoder 12 or the decoder 14, or the provided data/parameters may be "mapped" to customized hardware such as, for example, one or more application specific integrated circuits (ASICs) and/or one or more field programmable gate arrays (FPGAs), that perform the involved calculations. Moreover, an apparatus configured to determine the data/parameters may be integrated in (or connected to) the generic encoder 12 and/or the generic decoder 14.

Moreover, a parity-check matrix $H_{r \times n}$ can be described by its equivalent bipartite graph ("Tanner graph"), wherein each edge of the Tanner graph connects one variable node of a plurality of variable nodes (which from the first set of the bipartite graph) to one check node of a plurality of check nodes (which form the second set of the bipartite graph). For example, a parity-check matrix $H_{r \times n}$ of r rows and n columns can be represented by an equivalent bipartite graph with r check nodes and n variable nodes which has edges between the check nodes and the variable nodes if there are corresponding "is" in the parity-check matrix $H_{r \times n}$ (cf. R. Tanner, "*A Recursive Approach to Low Complexity Codes*", IEEE TRANSACTIONS IN INFORMATION THEORY, Volume 27, Issue 5, Pages 533-547, September 1981). Thus, the variable nodes represent code word bits and the check nodes represent parity-check equations.

In the Tanner graph of an LDPC code, any degree-s check node may be interpreted as a length-s single parity-check code, i.e., as an (s, s−1) linear block code. Thus, for generalizing an LDPC code, check nodes of the LDPC code may be replaced with a linear block code to enhance the overall minimum distance between the code words (cf. M.

Lentmaier et al., "*On Generalized Low-Density Parity-Check Codes based on Hamming Component Codes*", IEEE COMMUNICATIONS LETTERS, Volume 3, Issue 8, Pages 248-250, August 1999).

While the above approaches to channel coding such as generalized LDPC block codes have proven to perform well for a wide variety of scenarios, the urge for higher data throughput requires even more sophisticated solutions that achieve high data throughput with decent encoding/decoding resources. It is thus the object of the present disclosure to provide for a more efficient forward error correction channel coding technique applicable to the generic digital communications system 10. In this regard, it is noted that some or all of the above-described features may form part of implementation forms of the present disclosure as described in the following

SUMMARY

According to a first aspect of the present disclosure, there is provided a system for determining a GLDPC code for forward error correction channel coding, the system being configured to determine 2k parity check matrix columns of size k, label components of a first parity check matrix with n columns and k rows, wherein the first parity check matrix includes the 2k parity check matrix columns of size k, and select Cordaro-Wagner component code check matrices, wherein each of the selected Cordaro-Wagner component code check matrices has two rows which replace one row of the first parity check matrix to derive a second parity check matrix defining the generalized LDPC code, wherein the determining of the 2k parity check matrix columns of size k and the selecting of the Cordaro-Wagner component code check matrices are constrained to 2k parity check matrix columns of size k and Cordaro-Wagner component code check matrices which allow that rows and columns of a parity part consisting of 2k columns of the second parity check matrix which correspond to the 2k parity check matrix columns of size k, can be brought in an order in which the ordered rows and columns form a parity part which has a repeat-accumulate code structure.

In this regard, it is noted that the term "matrix" as used throughout the description and claims in particular refers to a set of (integer) values stored in a (logical) memory array or having assigned row and column indices. If not involving matrix algebra, or if respective matrix algebra routines are suitably redefined, the notion of rows and columns may even be changed or freely chosen. However, throughout the description and claims it is adhered to the mathematical concepts and notations regularly used in the art and they shall be understood as encompassing equivalent mathematical concepts and notations.

Thus, the structure of the parity part of the first parity check matrix (i.e., the columns of the first parity check matrix corresponding to the redundancy sequence) may be constrained such that the additional freedom in replacing rows of the first parity check matrix with rows of a Cordaro-Wagner component code check matrices can be exploited to achieve (optionally after a column permutation) a repeat-accumulate code structure (triangular form of the parity part of the second parity check matrix).

In a first possible implementation form of the system according to the first aspect, the system is configured to split/duplicate each entry of the 2k parity check matrix columns of size k into a vector of size two, wherein each vector of size two having a non-zero weight requires a corresponding non-zero entry, to determine the 2k columns of the second parity check matrix which correspond to the 2k parity check matrix columns of size k, and can be brought in an order in which the ordered rows and columns form a parity part which has a repeat-accumulate code structure.

Hence, the columns of size k may be expanded by replacing each column entry with a vector of size two such that the parity part formed by the 2k columns of the second parity check matrix has a size of 2k×2k and a triangular form.

In a second possible implementation form of the system according to the first aspect, the system is configured to iteratively label components of n–k unlabeled columns of the first parity check matrix based on a performance measure.

For example, columns of the information part may be iteratively labelled, wherein different labelling options may be compared and an option may be chosen if it leads to a higher girth of the code and/or a higher extrinsic message degree, EMD, or a higher approximated cycle EMD, ACE, of a smallest cycle generated by the option (as compared to other options). Thus, while the parity part may be labelled first and then kept substantially static to allow for easy encoding, the information part (i.e., the columns corresponding to the parity bits) may be labelled for best performance.

In a third possible implementation form of the system according to the first aspect, the system is configured to compare multiple alternatives for labelling different components of the n–k columns with non-zero entries and select one alternative achieving a highest performance score.

Hence, labelling may correspond to iteratively adding edges in the Tanner graph representation, wherein, for example, a progressive edge growth algorithm may be used to label the information part of the first parity check matrix.

In a fourth possible implementation form of the system according to the first aspect, a column of the Cordaro-Wagner component code check matrix is to have zero weight if a corresponding component of the row of the first parity check matrix is zero.

In this regard, it is noted that the vectors of size two may correspond to the columns of the Cordaro-Wagner component code check matrices such that the first parity check matrix may define an interleaver structure for Cordaro-Wagner component code en-/decoding units that correspond to super-check nodes, wherein each super-check node represents two check nodes of the Tanner graph representation of the second parity check matrix.

In a fifth possible implementation form of the system according to the first aspect, each of the 2k parity check matrix columns of size k has weight one or two.

In a sixth possible implementation form of the system according to the first aspect, k–1 parity check matrix columns of size k of the 2k parity check matrix columns of size k have a weight of one and the remaining parity check matrix columns of size k of the 2k parity check matrix columns of size k have weight two.

In a seventh possible implementation form of the system according to the first aspect, the 2k parity check matrix columns of size k are linearly independent.

In an eighth possible implementation form of the system according to the first aspect, selecting the Cordaro-Wagner component code check matrices includes replacing each non-zero entry in a row of the first parity check matrix with a non-zero column of a Cordaro-Wagner component code check matrix, wherein:

a row having exactly three non-zero entries in components which correspond to the 2k parity check matrix columns is replaced with a Cordaro-Wagner component code check matrix, where the columns of the Cordaro-Wagner component code check matrix which correspond to the 2k parity check matrix columns are linearly independent; and a row having exactly four non-zero entries in components which correspond to the 2k parity check matrix columns is replaced with a Cordaro-Wagner component code check matrix, where the columns Cordaro-Wagner component code check matrix which correspond to the 2k parity check matrix columns comprise three linearly independent columns.

The fifth to the eighth possible implementation forms facilitate achieving a repeat-accumulate code structure.

According to a second aspect of the present disclosure, there is provided a method of determining a GLDPC code for forward error correction channel coding, the method comprising determining 2k parity check matrix columns of size k, labeling components of a first parity check matrix with n columns and k rows, wherein the first parity check matrix includes the 2k parity check matrix columns of size k, and selecting Cordaro-Wagner component code check matrices, wherein each of the selected Cordaro-Wagner component code check matrices has two rows which replace a row of the first parity check matrix to derive a second parity check matrix defining the generalized LDPC code, wherein the determining of the 2k parity check matrix columns of size k and the selecting of the Cordaro-Wagner component code check matrices are constrained to 2k parity check matrix columns of size k and Cordaro-Wagner component code check matrices which allow that rows and columns of a parity part consisting of 2k columns of the second parity check matrix which correspond to the 2k parity check matrix columns of size k can be brought in an order in which the ordered rows and columns form a parity part which has a repeat-accumulate code structure.

As indicated above, this constrains the structure of the parity part of the first parity check matrix (i.e., the columns of the first parity check matrix corresponding to the redundancy sequence) such that the additional freedom in replacing rows of the first parity check matrix with rows of a Cordaro-Wagner component code check matrices can be exploited to achieve (optionally after a column permutation) a repeat-accumulate code structure (triangular form of the parity part of the second parity check matrix).

In a first possible implementation form of the method according to the second aspect, the method comprises splitting/duplicating each entry of the 2k parity check matrix columns of size k into a vector of size two, wherein each vector of size two having a non-zero weight requires a corresponding non-zero entry, to determine the 2k columns of the second parity check matrix which correspond to the 2k parity check matrix columns of size k, and can be brought in an order in which the ordered rows and columns form a parity part which has a repeat-accumulate code structure Hence, as indicated above, the columns of size k may be expanded by replacing each column entry with a vector of size two such that the parity part formed by the 2k columns of the second parity check matrix has a size of 2k×2k and a triangular form.

In a second possible implementation form of the method according to the second aspect, the method comprises iteratively labeling components of n–k unlabeled columns of the first parity check matrix based on a performance measure.

For example, as indicated above, columns of the information part may be iteratively labelled, wherein different labelling options may be compared and an option may be chosen if it leads to a higher girth of the code and/or a higher extrinsic message degree, EMD, or a higher approximated cycle EMD, ACE, of a smallest cycle generated by the option (as compared to other options). Thus, while the parity part may be labelled first and then kept substantially static to allow for easy encoding, the information part (i.e., the columns corresponding to the parity bits) may be labelled for best performance.

In a third possible implementation form of the method according to the second aspect, the method comprises comparing multiple alternatives for labelling different components of the n–k columns with non-zero entries and selecting one alternative achieving a highest performance score.

Hence, as indicated above, labelling may correspond to iteratively adding edges in the Tanner graph representation, wherein, for example, a progressive edge growth algorithm may be used to label the information part of the first parity check matrix.

In a fourth possible implementation form of the method according to the second aspect, a column of the Cordaro-Wagner component code check matrix has zero weight if a corresponding component of the row of the first parity check matrix is zero.

As indicated above, the vectors of size two may correspond to the columns of the Cordaro-Wagner component code check matrices such that the first parity check matrix may define an interleaver structure for Cordaro-Wagner component code en-/decoding units that correspond to super-check nodes, wherein each super-check node represents two check nodes of the Tanner graph representation of the second parity check matrix.

In a fifth possible implementation form of the method according to the second aspect, each of the 2k parity check matrix columns of size k has weight one or two.

In a sixth possible implementation form of the method according to the second aspect, k–1 parity check matrix columns of size k of the 2k parity check matrix columns of size k have a weight of one and the remaining parity check matrix columns of size k of the 2k parity check matrix columns of size k have weight two.

In a seventh possible implementation form of the method according to the second aspect, the 2k parity check matrix columns of size k are linearly independent.

In an eighth possible implementation form of the method according to the second aspect, selecting the Cordaro-Wagner component code check matrices includes replacing each non-zero entry in a row of the first parity check matrix with a non-zero column of a Cordaro-Wagner component code check matrix, wherein:

a row having exactly three non-zero entries in components which correspond to the 2k parity check matrix columns is replaced with a Cordaro-Wagner component code check matrix, where the columns of the Cordaro-Wagner component code check matrix which correspond to the 2k parity check matrix columns are linearly independent; and a row having exactly four non-zero entries in components which correspond to the 2k parity check matrix columns is replaced with a Cordaro-Wagner component code check matrix, where the columns Cordaro-Wagner component code check matrix which correspond to the 2k parity check matrix columns comprise three linearly independent columns.

The fifth to the eighth possible implementation forms facilitate achieving a repeat-accumulate code structure.

As noted above, the determined GLDPC code may be used for forward error correction in the system 10 of FIG. 1.

DETAILED DESCRIPTION

The following provides a non-limiting example of a procedure for determining a GLDPC code for forward error correction. The procedure as well as procedures involving the usage of the determined GLDPC code may be implemented by hardware, software, or a combination of hardware and software. For example, the procedure of determining the GLDPC code may be automatically carried-out by a computer comprising a processor which carries out machine-readable instructions persistently stored on a machine-readable medium. Moreover, procedures involving the usage of the determined GLDP code, such as encoding/decoding an information sequence $IS_1$ may be automatically carried-out by the system 10 which may have been designed or configured in accordance with the determined GLDPC code.

Figure 1:
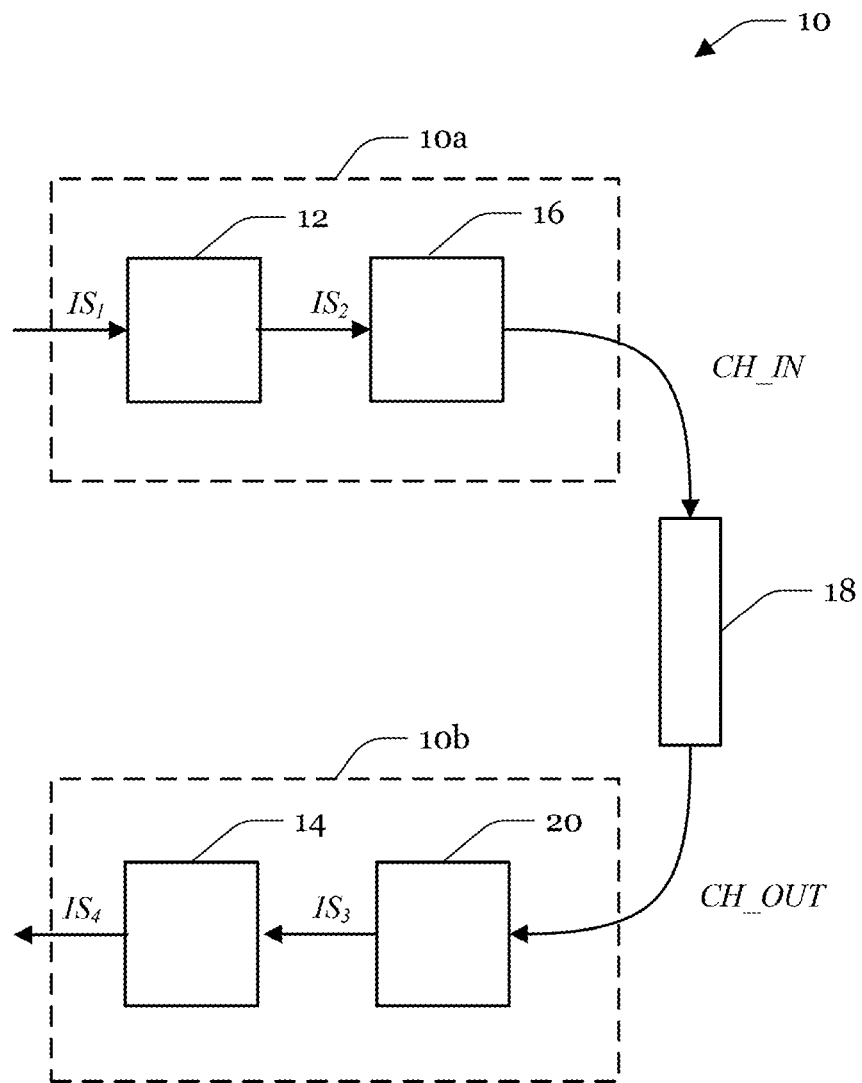
FIG. 1 is a block diagram illustrating a generic digital communications system in which the elements of the present disclosure may be implemented.
Figure 2:
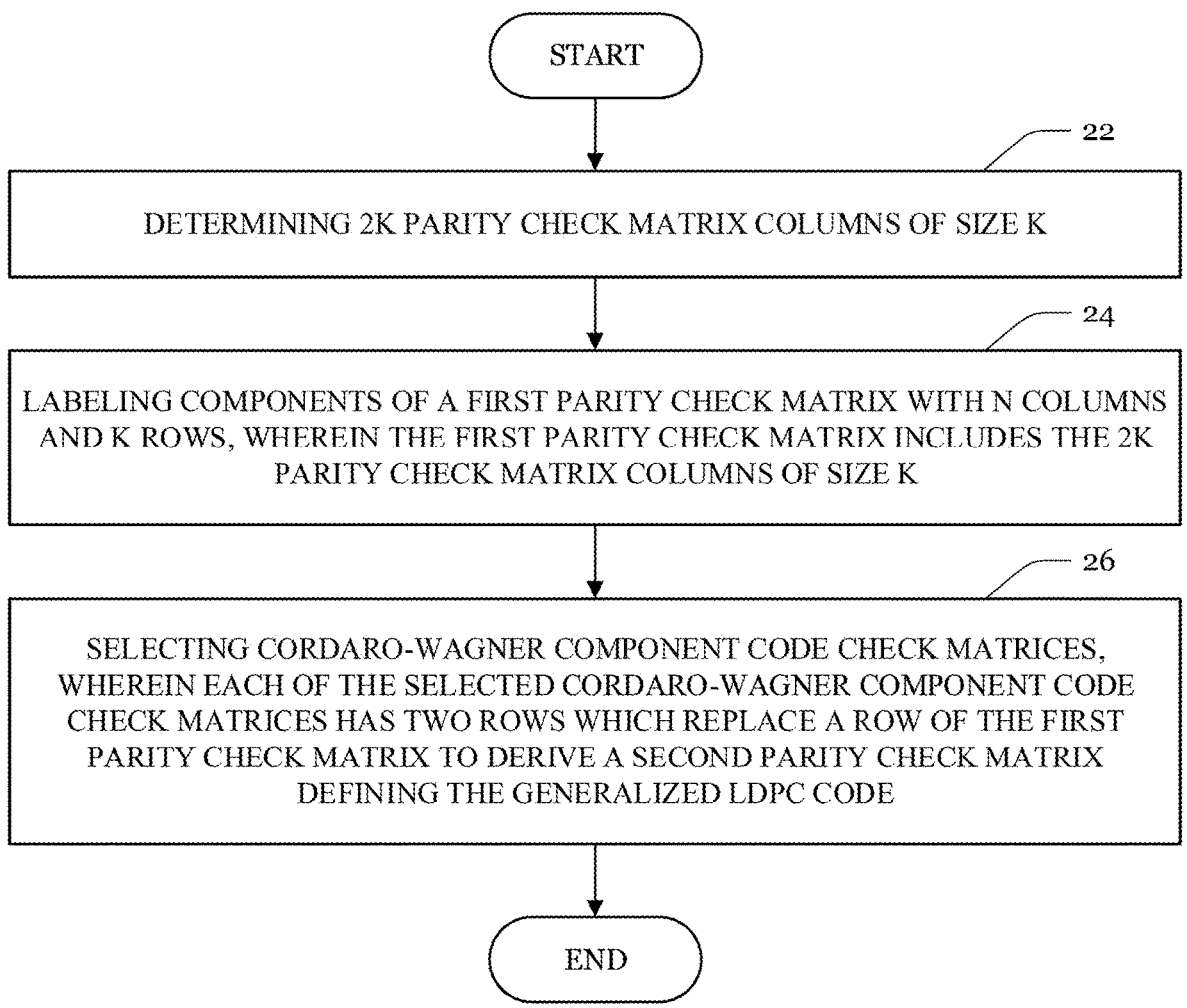
FIG. 2 is a flow-chart of a procedure for determining the GLDPC code.
Figure 3:
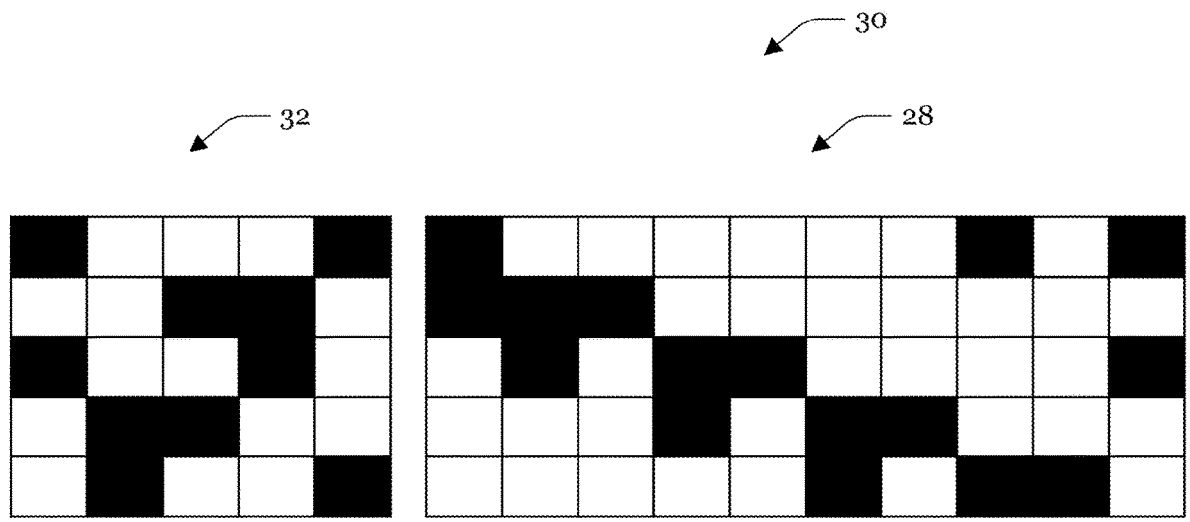
FIG. 3 illustrates an exemplary structure of the parity part of the first parity check matrix.

As shown in FIG. 2, the procedure may involve a step 22 of determining 2k parity check matrix columns of size k as shown in FIG. 3 which illustrates an exemplary structure of a parity part 28 of the first parity check matrix 30 in array form, wherein black squares indicate entries of non-zero weight (i.e., '1s') and white squares indicate entries of zero weight (i.e., '0s'). The parity part 28 comprises the determined ten columns of length five. In the exemplary structure, the columns of the parity part are linearly independent and comprise either one or two entries of non-zero weight. In particular, four columns have one entry of non-zero weight and the remaining columns have two entries of non-zero weight.

Figure 5:
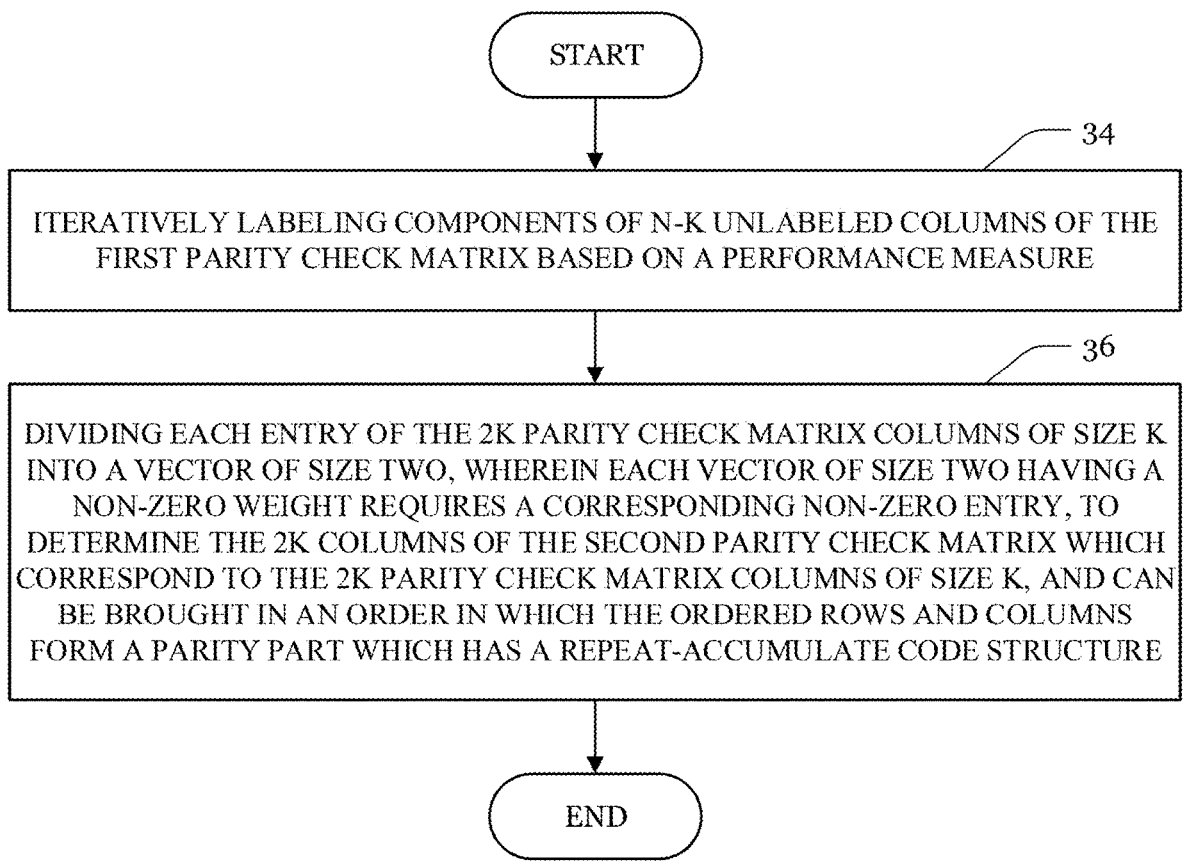
FIG. 5 shows additional steps of the procedure illustrated in FIG. 2.

At step 24, the procedure may be continued with labelling components of the first parity check matrix 30 with n columns and k rows, wherein the first parity check matrix 30 includes the 2k parity check matrix columns of size k. As shown in FIG. 3, labelling the components may involve labelling the columns of the information part 32 of the first parity check matrix 30. For example, as indicated in step 34 in FIG. 5, the information part 32 may be labelled by performing a progressive edge growth algorithm.

At step 26, Cordaro-Wagner component code check matrices may be selected, wherein each of the selected Cordaro-Wagner component code check matrices has two rows which replace a row of the first parity check matrix to derive a second parity check matrix defining the generalized LDPC code. For example, as indicated in step 36 of FIG. 5, each entry of the parity part 28 may be split/duplicated into a vector of size two, wherein entries of zero weight are split/duplicated into a zero vector whereas entries of non-zero weight are split/duplicated into a vector having one or two non-zero entries.

Figure 4:
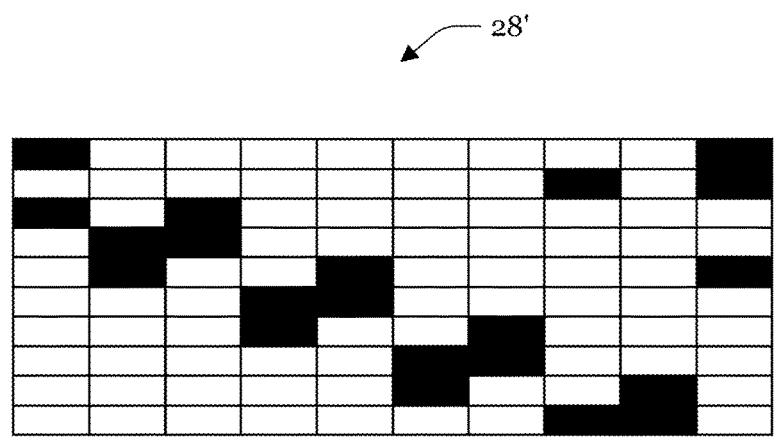
FIG. 4 illustrates an exemplary structure of the parity part of the second parity check matrix.

As shown in in FIG. 4, the replacing may be made under the provision that the rows and columns of the parity part 28' consisting of 2k columns of the second parity check matrix can be brought in an order in which the ordered rows and columns form a parity part which has a repeat-accumulate code structure. For example, the parity part $H_2$ of the LDPC parity-check matrix:

$$H_2^{EIRA} = \begin{bmatrix} 1 & 0 & 0 & 0 & 0 & 0 & 0 & 1 & 0 & 1 \\ 1 & 1 & 1 & 0 & 0 & 0 & 0 & 0 & 0 & 0 \\ 0 & 1 & 0 & 1 & 1 & 0 & 0 & 0 & 0 & 1 \\ 0 & 0 & 0 & 1 & 0 & 1 & 1 & 0 & 0 & 0 \\ 0 & 0 & 0 & 0 & 0 & 1 & 0 & 1 & 1 & 0 \end{bmatrix}$$

may be chosen such that, after replacing the rows of the first parity check matrix with rows of a Cordaro-Wagner component code, an extended irregular repeat-accumulate (EIRA) code can be obtained.

Replacing may start at the first row of $H_2^{EIRA}$ which has the following entries:
1 0 0 0 0 0 0 1 0 1

By replacing the entries with vectors of size two using $$\begin{bmatrix} 1 \\ 0 \end{bmatrix}, \begin{bmatrix} 0 \\ 1 \end{bmatrix}, \begin{bmatrix} 1 \\ 1 \end{bmatrix},$$

two rows of a generalized EIRA (GEIRA) code may be maintained, wherein the rows have the entries

| 1 | 0 | 0 | 0 | 0 | 0 | 0 | 0 | 0 | 1 |
|---|---|---|---|---|---|---|---|---|---|
| 0 | 0 | 0 | 0 | 0 | 0 | 0 | 1 | 0 | 1 |

The second row of the parity part $H_2^{EIRA}$ which has
1 1 1 0 0 0 0 0 0 0
as entries may be replaced using $$\begin{bmatrix} 1 \\ 0 \end{bmatrix}, \begin{bmatrix} 0 \\ 1 \end{bmatrix}, \begin{bmatrix} 1 \\ 1 \end{bmatrix}$$

with another two rows of the GEIRA code having

| 1 | 0 | 1 | 0 | 0 | 0 | 0 | 0 | 0 | 0 |
|---|---|---|---|---|---|---|---|---|---|
| 0 | 1 | 1 | 0 | 0 | 0 | 0 | 0 | 0 | 0 | as entries. The third row of the parity part $H_2^{EIRA}$ which has
0 1 0 1 1 0 0 0 0 1
as entries may be replaced using $$\begin{bmatrix} 1 \\ 0 \end{bmatrix}, \begin{bmatrix} 0 \\ 1 \end{bmatrix}, \begin{bmatrix} 1 \\ 1 \end{bmatrix}$$

with another two rows of the GEIRA code having

| 0 | 0 | 0 | 0 | 1 | 0 | 0 | 0 | 0 | 1 |
|---|---|---|---|---|---|---|---|---|---|
| 0 | 1 | 0 | 1 | 1 | 0 | 0 | 0 | 0 | 0 | as entries. The fourth row of the parity part $H_2^{EIRA}$ which has 0 0 0 1 0 1 1 0 0 0 as entries may be replaced using $$\begin{bmatrix}1\\0\end{bmatrix}, \begin{bmatrix}0\\1\end{bmatrix}, \begin{bmatrix}1\\1\end{bmatrix}$$

with another two rows of the GEIRA code having

| 0 | 0 | 0 | 1 | 0 | 0 | 1 | 0 | 0 | 0 |
|---|---|---|---|---|---|---|---|---|---|
| 0 | 0 | 0 | 0 | 0 | 1 | 1 | 0 | 0 | 0 | as entries. The fifth row of the parity part $H_2^{EIRA}$ which has 0 0 0 0 0 1 0 1 1 0 as entries may be replaced using $$\begin{bmatrix}1\\0\end{bmatrix}, \begin{bmatrix}0\\1\end{bmatrix}, \begin{bmatrix}1\\1\end{bmatrix}$$

with another two rows of the GEIRA code having

| 0 | 0 | 0 | 0 | 0 | 1 | 0 | 0 | 1 | 0 |
|---|---|---|---|---|---|---|---|---|---|
| 0 | 0 | 0 | 0 | 0 | 0 | 0 | 1 | 1 | 0 | as entries. The parity part of the second parity check matrix may thus be $$H_2^{GEIRA} = \begin{bmatrix} 1 & 0 & 0 & 0 & 0 & 0 & 0 & 0 & 0 & 1 \\ 0 & 0 & 0 & 0 & 0 & 0 & 0 & 1 & 0 & 1 \\ 1 & 0 & 1 & 0 & 0 & 0 & 0 & 0 & 0 & 0 \\ 0 & 1 & 1 & 0 & 0 & 0 & 0 & 0 & 0 & 0 \\ 0 & 1 & 0 & 0 & 1 & 0 & 0 & 0 & 0 & 1 \\ 0 & 0 & 0 & 1 & 1 & 0 & 0 & 0 & 0 & 0 \\ 0 & 0 & 0 & 1 & 0 & 0 & 1 & 0 & 0 & 0 \\ 0 & 0 & 0 & 0 & 0 & 1 & 1 & 0 & 0 & 0 \\ 0 & 0 & 0 & 0 & 0 & 1 & 0 & 0 & 1 & 0 \\ 0 & 0 & 0 & 0 & 0 & 0 & 0 & 1 & 1 & 0 \end{bmatrix}$$

After reordering the columns in accordance with $$P_{column} = \begin{pmatrix} 1 & 2 & 3 & 4 & 5 & 6 & 7 & 8 & 9 & 10 \\ 1 & 3 & 2 & 5 & 4 & 7 & 6 & 9 & 8 & 10 \end{pmatrix}$$

and reordering the rows in accordance with $$P_{row} = \begin{pmatrix} 1 & 2 & 3 & 4 & 5 & 6 & 7 & 8 & 9 & 10 \\ 1 & 3 & 4 & 5 & 6 & 7 & 8 & 9 & 10 & 2 \end{pmatrix}$$

an EIRA structure may be obtained:

$$H_2^{EIRA} = \begin{array}{c} \\ 1 \\ 3 \\ 4 \\ 5 \\ 6 \\ 7 \\ 8 \\ 9 \\ 10 \\ 2 \end{array} \begin{bmatrix} 1 & 3 & 2 & 5 & 4 & 7 & 6 & 9 & 8 & 10 \\ 1 & 0 & 0 & 0 & 0 & 0 & 0 & 0 & 0 & 1 \\ 1 & 1 & 0 & 0 & 0 & 0 & 0 & 0 & 0 & 0 \\ 0 & 1 & 1 & 0 & 0 & 0 & 0 & 0 & 0 & 0 \\ 0 & 0 & 1 & 1 & 0 & 0 & 0 & 0 & 0 & 1 \\ 0 & 0 & 0 & 1 & 1 & 0 & 0 & 0 & 0 & 0 \\ 0 & 0 & 0 & 0 & 1 & 1 & 0 & 0 & 0 & 0 \\ 0 & 0 & 0 & 0 & 0 & 1 & 1 & 0 & 0 & 0 \\ 0 & 0 & 0 & 0 & 0 & 0 & 1 & 1 & 0 & 0 \\ 0 & 0 & 0 & 0 & 0 & 0 & 0 & 1 & 1 & 0 \\ 0 & 0 & 0 & 0 & 0 & 0 & 0 & 0 & 1 & 1 \end{bmatrix}$$

In this regard, it is noted that although the procedure is described in relation to a specific example of size 5×10, codes of other sizes may be generated analogously:

$$H_2^{GEIRA} = \begin{bmatrix} 1 & 0 & 0 & 0 & 0 & 0 & 0 & \ldots & 0 & 1 & 0 & 1 \\ 1 & 1 & 1 & 0 & 0 & 0 & \ldots & 0 & 0 & 0 & 0 & 0 \\ 0 & 1 & 0 & 1 & 1 & \ldots & 0 & 0 & 0 & 0 & 0 & 1 \\ 0 & 0 & 0 & 1 & \ldots & 1 & 1 & 0 & 0 & 0 & 0 & 0 \\ 0 & 0 & 0 & \ldots & 0 & 1 & 0 & 1 & 1 & 0 & 0 & 0 \\ 0 & 0 & \ldots & 0 & 0 & 0 & 0 & 1 & 0 & 1 & 1 & 0 \end{bmatrix}$$

Heretofore:

a. non-zero entries in a row of the parity part with three non-zero entries may be replaced by $$\begin{bmatrix}1\\0\end{bmatrix}, \begin{bmatrix}0\\1\end{bmatrix}, \text{ and } \begin{bmatrix}1\\1\end{bmatrix},$$

respectively.

b. non-zero entries in a row of the parity part with four non-zero entries may be replaced by $$\begin{bmatrix}1\\0\end{bmatrix}, \begin{bmatrix}0\\1\end{bmatrix}, \begin{bmatrix}1\\1\end{bmatrix}, \text{ and } \begin{bmatrix}1\\0\end{bmatrix},$$

respectively.

c. columns and rows may be reordered in accordance with $$P_{column} = \begin{pmatrix} 1 & 2 & 3 & \ldots & 2s & 2s+1 & \ldots & k & k \\ 1 & 3 & 2 & \ldots & 2s+1 & 2s & \ldots & a & k \end{pmatrix},$$

with $a = \begin{cases} k, & k \text{ is even} \\ k-1, & k \text{ is odd} \end{cases}$, $s = \overline{2K \ldots \left\lfloor \frac{k}{2} \right\rfloor}$, and $$P_{row} = \begin{pmatrix} 1 & 2 & 3 & \ldots & s & \ldots & k \\ 1 & 3 & 4 & \ldots & s+1 & \ldots & 2 \end{pmatrix},$$

with $s = \overline{2 \ldots k-1}$

Once, the EIRA structure has been obtained, encoding may be performed as described in U.S. Pat. No. 7,627,801 B2 or in EP 1,816,750 A1.

Moreover, decoding may be performed as described in EP 1,816,750 A1.

What is claimed is:

1. A system for determining a generalized Low-Density Parity-Check (LDPC) code for forward error correction channel coding, the system including a processor being configured to:
   determine 2k parity check matrix columns of size k, wherein k is an integer;
   label components of a first parity check matrix with n columns and k rows, wherein n is an integer, and wherein the first parity check matrix includes the 2k parity check matrix columns of size k; and
   select Cordaro-Wagner component code check matrices, wherein each of the selected Cordaro-Wagner component code check matrices has two rows which replace one row of the first parity check matrix to derive a second parity check matrix defining the generalized LDPC code;
   wherein the determination of the 2k parity check matrix columns of size k and the selection of the Cordaro-Wagner component code check matrices are constrained to 2k parity check matrix columns of size k and Cordaro-Wagner component code check matrices which allow that rows and columns of a parity part consisting of 2k columns of the second parity check matrix which correspond to the 2k parity check matrix columns of size k, can be brought in an order in which the ordered rows and columns form a parity part which has a repeat-accumulate code structure.

2. The system of claim 1, the processor being configured to:
   split/duplicate each entry of the 2k parity check matrix columns of size k into a vector of size two, wherein each vector of size two having a non-zero weight requires a corresponding non-zero entry, to determine the 2k columns of the second parity check matrix which correspond to the 2k parity check matrix columns of size k, and can be brought in an order in which the ordered rows and columns form a parity part which has a repeat-accumulate code structure.

3. The system of claim 2, the processor being configured to:
   iteratively label components of n−k unlabeled columns of the first parity check matrix based on a performance measure.

4. The system of claim 1, the processor being configured to:
   compare multiple alternatives for labelling different components of the n−k columns with non-zero entries; and
   select one alternative achieving a highest performance score.

5. The system of claim 1, wherein a column of the Cordaro-Wagner component code check matrix has a zero weight if a corresponding component of the row of the first parity check matrix is zero.

6. The system of claim 1, wherein each of the 2k parity check matrix columns of size k has weight one or two.

7. The system of claim 6, wherein k−1 parity check matrix columns of size k of the 2k parity check matrix columns of size k have a weight of one and the remaining parity check matrix columns of size k of the 2k parity check matrix columns of size k have weight two.

8. The system of claim 7, wherein the 2k parity check matrix columns of size k are linearly independent.

9. The system of claim 1, wherein the selection of the Cordaro-Wagner component code check matrices includes replacing each non-zero entry in a row of the first parity check matrix with a non-zero column of a Cordaro-Wagner component code check matrix, wherein:
   a row having exactly three non-zero entries in components which correspond to the 2k parity check matrix columns, is replaced with a Cordaro-Wagner component code check matrix having columns which correspond to the 2k parity check matrix columns, wherein said columns are linearly independent; and
   a row having exactly four non-zero entries in components which correspond to the 2k parity check matrix columns is replaced with a Cordaro-Wagner component code check matrix having columns which correspond to the 2k parity check matrix columns, wherein three of said columns are linearly independent.

10. A method of determining a generalized Low-Density Parity-Check (LDPC) code for forward error correction channel coding, the method comprising:
    determining 2k parity check matrix columns of size k, wherein k is an integer;
    labeling components of a first parity check matrix with n columns and k rows, wherein n is an integer, and wherein the first parity check matrix includes the 2k parity check matrix columns of size k; and
    selecting Cordaro-Wagner component code check matrices, wherein each of the selected Cordaro-Wagner component code check matrices has two rows which replace a row of the first parity check matrix to derive a second parity check matrix defining the generalized LDPC code;
    wherein the determining of the 2k parity check matrix columns of size k and the selecting of the Cordaro-Wagner component code check matrices are constrained to 2k parity check matrix columns of size k and Cordaro-Wagner component code check matrices which allow that rows and columns of a parity part consisting of 2k columns of the second parity check matrix which correspond to the 2k parity check matrix columns of size k can be brought in an order in which the ordered rows and columns form a parity part which has a repeat-accumulate code structure.

11. The method of claim 10, the method comprising:
    splitting/duplicating each entry of the 2k parity check matrix columns of size k into a vector of size two, wherein each vector of size two having a non-zero weight requires a corresponding non-zero entry, to determine the 2k columns of the second parity check matrix which correspond to the 2k parity check matrix columns of size k, and can be brought in an order in which the ordered rows and columns form a parity part which has a repeat-accumulate code structure.

12. The method of claim 11, comprising:
    iteratively labeling components of n−k unlabeled columns of the first parity check matrix based on a performance measure.

13. The method of claim 10, comprising:
    comparing multiple alternatives for labelling different components of the n−k columns with non-zero entries; and
    selecting one alternative achieving a highest performance score.

14. The method of claim 10, wherein a column of the Cordaro-Wagner component code check matrix has zero weight if at least one of the following is satisfied:
    a) a corresponding component of the row of the first parity check matrix is zero;
    b) each of the 2k parity check matrix columns of size k has weight one or two; and c) the 2k parity check matrix columns of size k are linearly independent.

15. The method of claim 10, wherein selecting the Cordaro-Wagner component code check matrices includes replacing each non-zero entry in a row of the first parity check matrix with a non-zero column of a Cordaro-Wagner component code check matrix, wherein:
- a row having exactly three non-zero entries in components which correspond to the 2k parity check matrix columns, is replaced with a Cordaro-Wagner component code check matrix having columns which correspond to the 2k parity check matrix columns, wherein said columns are linearly independent; and
- a row having exactly four non-zero entries in components which correspond to the 2k parity check matrix columns is replaced with a Cordaro-Wagner component code check matrix having columns which correspond to the 2k parity check matrix columns, wherein three of said columns are linearly independent.

* * * * *